April 12, 1960
C. A. ROSENCRANS
FREQUENCY MODULATION LIMITER WHICH DOES NOT DETUNE ASSOCIATED TUNED CIRCUIT
Filed Dec. 7, 1955
2,932,734
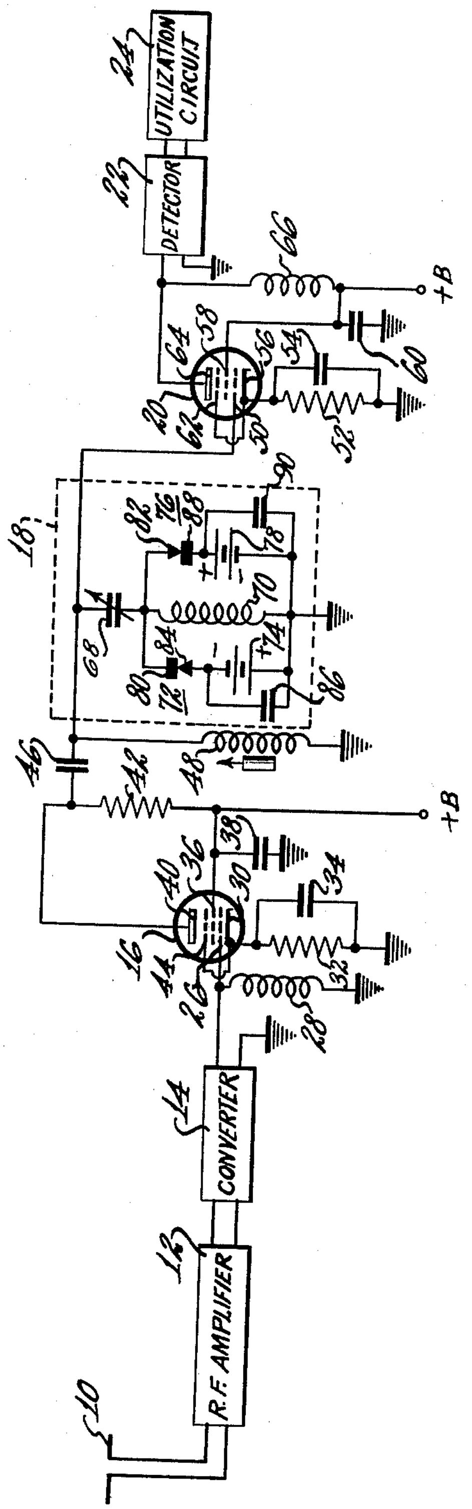
INVENTOR.
CHARLES A. ROSENCRANS
BY H. W. Newton
ATTORNEY 2,932,734

FREQUENCY MODULATION LIMITER WHICH DOES NOT DETUNE ASSOCIATED TUNED CIRCUIT

Charles A. Rosencrans, Barrington, N.J., assignor to Radio Corporation of America, a corporation of Delaware Application December 7, 1955, Serial No. 551,643

6 Claims. (Cl. 250—20)

This invention relates to frequency modulation (FM) signal amplitude limiter circuits, and particularly to gate-type or diode limiter circuits.

Limiting of an FM signal wave to eliminate undesired noise appearing as amplitude modulation of the signal wave may be accomplished by a number of known systems. One such system provides a gate or diode limiter in which oppositely poled diodes, either electron tube or crystal, are connected in parallel with a tuned circuit across which the signal is developed. The diodes may be biased by a low D.C. voltage to allow the signal to be developed across the tuned circuit unaffected to any appreciable extent by the action of the diodes to a threshold level. However, when the signal voltage reaches an instantaneous peak equal to the threshold bias voltage on the diodes, the diodes conduct heavily to damp the tuned circuit and substantially prevent a greater amplitude of signal from being developed across the tuned circuit. This action effectively clips any undesired amplitude modulation noise from the received FM signal wave.

However, as the signal amplitude or voltage overcomes the diode bias and causes the diodes to conduct, considerable detuning of the associated tuned circuit may result and thus decrease the dynamic range of the limiter, that is, the range of input voltages to the limiter over which satisfactory limiting will take place, and shift the center frequency of tuned circuit pass-band.

It is therefore an object of the present invention to provide an improved diode limiting circuit for an FM receiver which compensates for detuning effects normally caused by the diode limiting action.

It is another object of the present invention to provide an improved crystal diode limiting circuit for an FM receiver having a wide dynamic range and negligible circuit detuning effects.

In accordance with the invention, the limiter means in a frequency modulation signal receiver is provided with limiting threshold-biased diodes across a tuned circuit in the signal channel, preceding the discriminator or detector, with coupling to the signal channel provided through capacitive means in series relation with the limiting diodes for effectively isolating the detrimental effects on the tuned circuit caused by conduction of the diodes upon limiting, thereby to permit the signal input voltage to the limiter to be varied over a wide range of values without appreciable detuning of the circuit.

However, the invention will be further understood when the following description is read in connection with the accompanying drawing, in which the single figure is a schematic circuit diagram of an FM receiver provided with a limiter circuit in accordance with the present invention.

Referring to the drawing, in the FM receiving system shown FM signals received on an antenna 10 are amplified in a radio frequency amplifier 12 and applied to a suitable converter 14 where they are converted to an intermediate frequency signal. Signals from the converter 14 may be further amplified in an intermediate frequency amplifier or may be applied through a signal translating circuit including a limiter circuit having a driver tube 16 and a diode clipper or gate circuit 18 as indicated by the dotted line enclosure in the drawing, to an intermediate frequency amplifier represented by the amplifier stage having an amplifier tube 20. The signals are applied from the intermediate amplifier to a detector 22, and the output signal of the detector 22 may be applied to any utilization circuit 24 as indicated, generaly including an audio frequency amplifier and loudspeaker (not shown).

Referring now to the limiter circuit for the receiver, it will be seen that the intermediate frequency signal from the converter 14 is applied to the control grid 26 of the driver tube 16 and that the signal is developed across a grid circuit inductor 28 connected between the control grid 26 and ground for the system. Ground for the system may be a conductive chassis structure as is well known, or merely a common return conductor for the signal and operating currents of the receiver. The cathode 30 is connected to ground for the system through a cathode bias resistor 32 provided with a suitable bypass capacitor 34. The screen grid 36 is connected directly to a source of positive operating voltage, +B, and is bypassed to ground at signal frequencies by a screen bypass capacitor 38. The anode 40 is connected to the source of positive operating voltage, +B, through an anode resistor 42, and the suppressor grid 44 is connected directly to the cathode 30 of the driver tube 16.

Amplified signals at the anode 40 of the driver tube 16, are applied through a coupling capacitor 46 to a shunt load impedance such as a load inductor 48 across the limiter circuit. This may be a variably tunable inductor, as indicated, to facilitate tuning of the circuit. Although only the single load inductor 48 is shown across the circuit, the inductor 48 is tuned to parallel resonance with the combined output capacitance of the driver tube 16, the input capacitance of the amplifier tube 20, the stray capacitance of the circuit to ground for the receiver, and the distributed capacitance of the inductor 48 itself.

The intermediate frequency signal to be limited is developed across the load inductor 48 and applied to the gate or diode clipper circuit 18, the action of which will be more fully explained hereinafter, and then, after limiting is transferred directly to the control grid 50 of the amplifier tube 20. A cathode bias resistor 52, with a cathode bypass capacitor 54, is provided for the amplifier tube 20 to ground for the system. The screen grid 58 is connected directly to the source of positive operating potential, +B, and is bypassed to ground at signal frequencies by a screen bypass capacitor 60. The suppressor electrode 62 is connected directly to the cathode 56, and the anode 64 is connected to the source of positive operating voltage, +B, through an output coupling inductor 66 from which the limited intermediate frequency signal is applied to the detector 22 as referred to hereinbefore.

Referring now to the diode clipper or gate circuit 18, a variable compensating capacitor 68 is connected as a coupling element in series with the parallel combination of a first diode 72 in series with a first bias battery 74, and a second diode 76 in series with a second bias battery 78. The cathode 80 of the first diode is connected to the compensating capacitor 68, while the anode 82 of the second diode 76 is connected to the compensating capacitor 68. The anode 84 of the first diode is biased in a negative direction by the first bias battery 74 which is bypassed for signal frequencies by a bypass capacitor 86. The cathode 88 of the second diode 76 is biased in a positive direction by the second battery 78 which is bypassed at signal frequencies by a bypass capacitor 90.

At the frequencies used in FM transmission, the impedance levels of the circuit may be quite low. For instance, the load impedance for the driver tube 16 will be on the order of hundreds of ohms, so that it is necessary for proper limiting that the impedance of the diodes 72 and 76, when conducting, be made as low as possible. This is affected by connecting an inductor 70 in parallel with the diodes.

In operation, an FM signal wave from the driver amplifier circuit is developed across the resonant circuit of the load inductor 48 and the stray capacitance, and across the entire diode clipper circuit 18 which is connected in parallel with the load inductor 48. It will be seen that as the signal voltage goes positive, for instance, the first diode 72 cannot conduct at any time since its cathode 80 will be positive with respect to its anode 84, but the second diode 76 will conduct when its anode 82 becomes more positive than the bias on its cathode 88. Thus the signal voltage will rise unimpeded until it reaches a voltage equal to the voltage of the bias battery 78, at which time the diode will conduct and provide a low impedance connection across the load inductor 48 and thus prevent any further substantial rise of signal voltage across the load inductor 48. The opposite action will occur when the signal voltage swings in the opposite or negative direction, that is, the second diode 76 will be unable to conduct and the first diode 72 will conduct when its cathode 80 becomes more negative than the negative bias on its anode 84.

In the absence of the compensating capacitor 68, the conduction of the diodes as the input signal voltage becomes large would tend to be of sufficient magnitude to have a substantially controlling effect on the impedance of the load presented to the driver tube 16, that is, the tuning of the parallel combination of the inductor 48 and the stray capacitances is effectively shifted by the resistance in the circuit, which resistance is essentially that of the diodes 72 and 76 when conducting. The detuning caused by such conduction will broaden the band width of the tuned circuit as the input signal voltage increases but will also seriously shift the center frequency of the pass band of the tuned circuit of the load inductor 48.

However, the introduction of compensating capacitor 68 in series with the limiting diodes 72 and 76 effectively eliminates the detuning effects caused by the change in resistance of the diodes 72 and 76 as the input signal voltage to the limiter 18 is varied. The pass band of the circuit thus broadens as the diodes 72 and 76 conduct, but the center frequency does not shift if the compensating capacitor 68 is adjusted to its optimum value. The capacitance of the compensating capacitor 68 is of the same order as the tuning capacitance for the circuit. Proper adjustment of the compensating capacitor 68 to the optimum value is attained experimentally by adjusting it to a value such that no appreciable shift in the center frequency of the pass band is noticeable as the value of the input signal voltage is varied.

If the value of the compensating capacitor 68 is at other than the optimum value, the center frequency of the pass band will shift and lower the dynamic range of the limiter, that is, the tuning center to pass band will change but the frequency of the incoming signal will remain the same, thus cutting off either the upper or the lower side bands of the received signal.

As an example, using a commercial type 404A pentode driver tube 16 that has a very high mutual transconductance, and a commercial type 6AK5 amplifier tube 20, a pair of commercial type 1N100 crystal diodes 72 and 76, a bias voltage on each diode between 2 and 4 volts, and a variable 7 to 35 mmfd. compensating capacitor 68, a dynamic limiting range of signal input voltages of more than 20 decibels may be obtained with the compensating capacitor 68 adjusted to its optimum value at an operating frequency of 130 megacycles. The center frequency will not be substantially changed over the entire 20 decibel range, and both upper and lower side bands of the received signal are properly limited and applied to the amplifier tube 20.

A signal amplitude limiter for a frequency modulation receiver constructed in accordance with the present invention is characterized by the simplicity with which it is applied to the receiver circuits and by the large dynamic range over which proper limiting of the signal voltages may be obtained.

What is claimed is:

1. A signal amplitude limiter circuit for a frequency modulation signal receiver, comprising in combination, a tuned signal load circuit, means providing a pair of unilaterally conducting circuit elements connected in parallel across said circuit and biased to conduct on excursions of a received frequency modulated signal above a predetermined amplitude value for limiting said signal substantially to said predetermined value, and compensating capacitive means connected in series with the parallel combination of said unilaterally conducting circuit elements to prevent detuning of said tuned signal load impedance as said unilaterally conducting elements conduct to limit said signal.

2. In a frequency modulation signal receiver, a signal amplitude limiter, comprising in combination, a signal amplifier having a tuned signal output load impedance element including inductive and capacitive reactance components, means providing a pair of unilaterally conducting circuit elements coupled in oppositely poled parallel relation with said impedance element, means for biasing said unilaterally conducting elements to conduct on excursions of the voltage of a received frequency modulated signal above a predetermined value to limit the positive and negative excursions of said signal voltage substantially to said predetermined value, and compensating means including a capacitor having a reactive value of the order of the value of the capacitive reactance of said tuned signal output load impedance element connected in series between said parallel combination of said unilaterally conducting circuit elements and said impedance element to prevent detuning of said tuned signal load impedance element as said unilaterally conducting elements conduct to limit said signal voltage.

3. In a frequency modulation signal receiver, a signal amplitude limiting circuit comprising in combination; driver amplifier means for a received signal having a tuned signal circuit providing a band-pass frequency response characteristics about a center frequency; signal amplitude limiting means including a pair of oppositely poled, parallel connected, unilaterally conducting elements connected in parallel relation with said tuned circuit; means for biasing said elements to conduct at instantaneous values of signal voltage exceeding a predetermined value to damp said tuned circuit for limiting the positive and negative excursions of signal voltage to substantially said predetermined level; and means including a compensating capacitor connected in series between said parallel combination of said unilaterally conducting elements and said tuned circuit to compensate for detuning effects on the band-pass characteristic of said tuned circuit caused by conducting of said unilaterally conducting elements.

4. A signal amplitude limiting circuit for a frequency modulation receiver, comprising in combination, means providing a tuned signal load circuit including inductive and capactive reactive components having a band-pass characteristic about a center frequency, signal amplitude limiting means including a pair of oppositely poled, unilaterally conducting circuit elements each connected in parallel relation with said tuned signal load circuit and biased to conduct at instantaneous values of signal voltage exceeding a predetermined value for damping said tuned circuit to limit the signal to substantially said predetermined value, and capacitive compensating means serially connected between said parallel combination of said unilaterally conducting elements and said tuned signal load circuit to compensate for detuning effects on the band-pass characteristics of said load circuit caused by the conduction of said unilaterally conducting elements.

5. A signal amplitude limiting circuit for a frequency modulation signal receiver having an inductance-capacitance tuned circuit across which a received frequency modulation signal is developed, comprising in combination, means providing a pair of oppositely poled diodes connected in parallel relation across said tuned circuit and biased to conduct on excursions of the signal above a predetermined amplitude value for limiting the signal to substantially said predetermined value, and means including a compensating capacitor connected in series with the parallel combination of said diodes to prevent detuning of said tuned circuit as said diodes conduct to affect limiting of said signal.

6. In a frrequency modulation signal receiver a signal amplitude limiting circuit, comprising in combination, driver amplifier means including an inductance-capacitance tuned signal load circuit having a band-pass frequency response characteristic about a center frequency, signal amplitude limiting means including a pair of oppositely poled diodes each connected in parallel relation with said tuned signal load circuit, means for biasing said diodes to conduct at instantaneous values of a signal voltage exceeding a predetermined value for damping said signal load circuit to limit the positive and negative excursions of said signal voltage to substantially said predetermined value, and compensating means including a capacitor having a value on the order of the capacitance value of said tuned signal load circuit serially connected between said parallel combination of said diodes and said tuned signal load circuit to compensate for the detuning effects of the band-pass characteristics of said tuned signal load circuit caused by the conduction of said diodes.

References Cited in the file of this patent

UNITED STATES PATENTS

| | | |
|---|---|---|
| 2,285,044 | Morris | June 2, 1942 |
| 2,485,731 | Gruen | Oct. 25, 1949 |
| 2,512,637 | Frazier | June 27, 1950 |

OTHER REFERENCES

Granlund: Interference in FM Reception, Tech. Report #42, January 20, 1949, Res. Lab. of Electronics, M.I.T.; only page 16 cited.

Arguimbau and Granlund: Sky-Wave FM Receiver, Electronics, December 1949, page 102.

Toth: AM and Narrow-Band FM in UHF Communications, Electronics, page 103, March 1949.